United States Patent [19]

Shimizu et al.

[11] 4,023,053

[45] May 10, 1977

[54] VARIABLE CAPACITY DIODE DEVICE

[75] Inventors: Shoichi Shimizu, Yokohama; Hisashi Yamada, Oiso, both of Japan

[73] Assignee: Tokyo Shibaura Electric Co., Ltd., Kawasaki, Japan

[22] Filed: Dec. 15, 1975

[21] Appl. No.: 640,891

[30] Foreign Application Priority Data

Dec. 16, 1974 Japan .................... 49-152470[U]

[52] U.S. Cl. .............................. 307/320; 307/303; 357/14; 334/15
[51] Int. Cl.² ...................................... H03K 17/00
[58] Field of Search ............. 307/320, 303; 357/14; 334/15

[56] References Cited

UNITED STATES PATENTS

| 3,444,452 | 5/1969 | Janssen | 357/14 |
| 3,450,965 | 6/1969 | Kubota | 357/14 |
| 3,454,841 | 7/1969 | Urba et al. | 357/14 |
| 3,680,196 | 8/1972 | Leinkram | 357/65 |
| 3,794,942 | 2/1974 | Blankenburg | 334/15 |
| 3,906,539 | 9/1975 | Sauermann et al. | 357/14 |

*Primary Examiner*—Stanley D. Miller, Jr.
*Assistant Examiner*—B. P. Davis
*Attorney, Agent, or Firm*—Oblon, Fisher, Spivak, McClelland & Maier

[57] ABSTRACT

A semiconductor chip including at least three variable capacity diodes for use at a frequency of 30 to 300 megaherzs is mounted on a grounding member so as to be sealed within a package. A plurality of external connection conductors each coupled to the diode and a plurality of external ground conductors coupled to the grounding member extend out of the package. Each ground conductor is disposed between the adjacent two of the external ground conductors. The arrangement permits a decrease of interference occurring due to a stray capacitance between the diodes.

9 Claims, 9 Drawing Figures

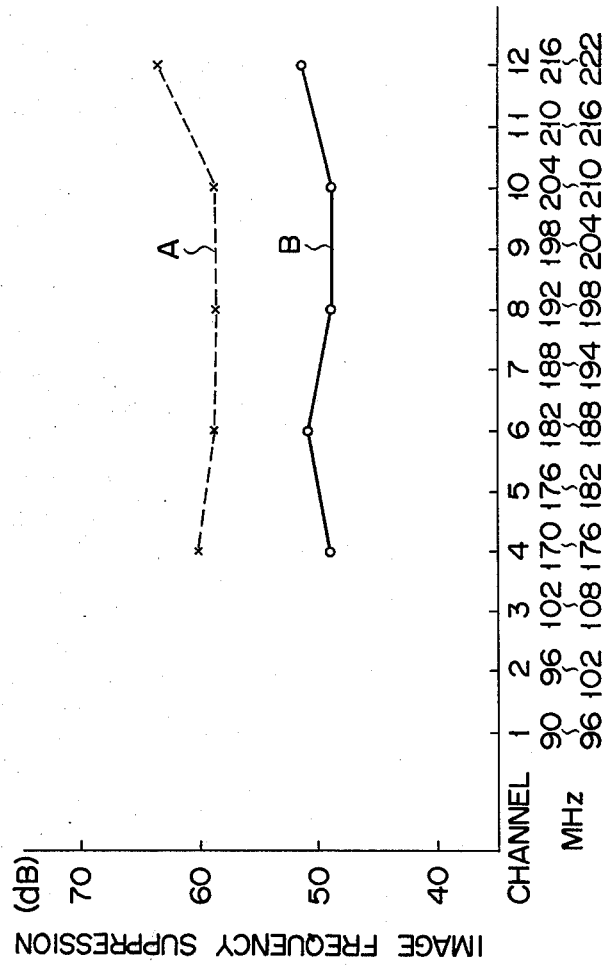

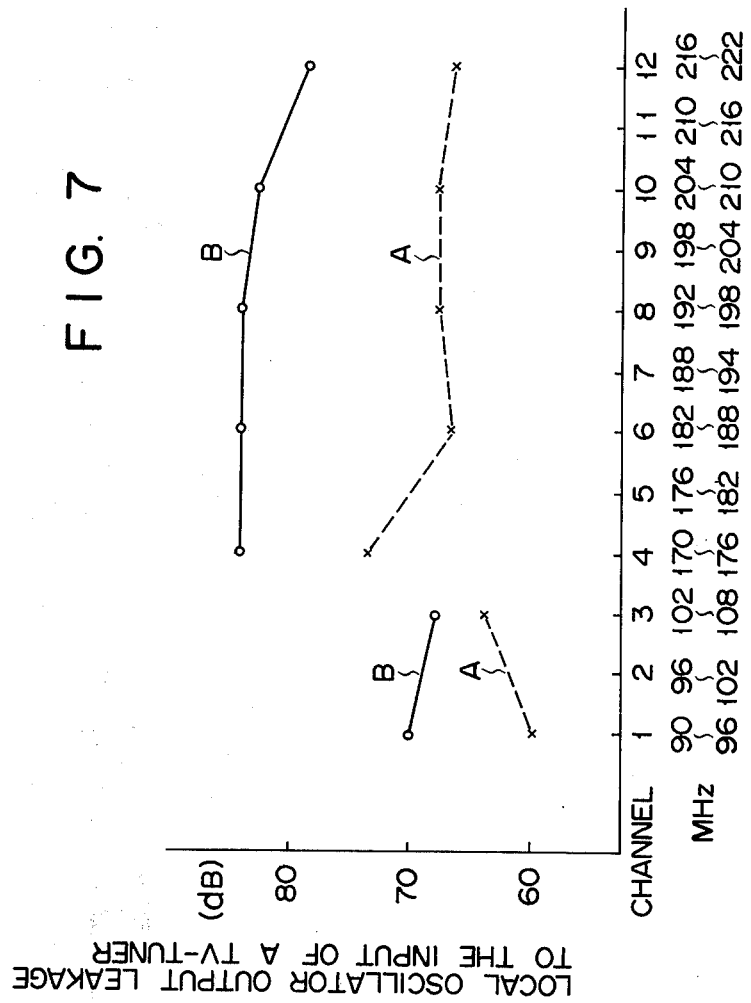

VARIABLE CAPACITY DIODE DEVICE

This invention relates to a variable capacity diode device sealing into a package a semiconductor chip having a plurality of variable capacity diodes formed on a semiconductor substrate.

In an electronically controllable tuner of a television receiver, for example, use is made of a diode device having four variable capacity diodes $V_1$, $V_2$, $V_3$ and $V_4$ (hereinafter referred to merely as the diode) as shown, for example, in FIG. 5. The diode $V_1$ is connected to a high frequency amplifier 1 for tuning a receiving wave; the diodes $V_2$ and $V_3$ are connected to an interstage resonance circuit 2; and the diode $V_4$ is used for controlling an oscillation frequency of a local oscillator 4 adapted to supply a local oscillation output to a mixer 3 for obtaining an intermediate frequency. A common control voltage 5 is supplied through a corresponding resistance R to each of these diodes. It is preferred that the capacitance of each diode be substantially equally varied with respect to the control voltage. Where, however, four diodes are formed on a semiconductor substrate in the form of an integrated circuit, the electrical properties of these diodes are of necessity made equal to each other due to their very close arrangement. On the other hand, however, a mutual interference of signals is produced due to a close arrangement of each element. Since a high frequency of VHF band, i.e., 30 MHz to 300 MHz is employed in the television receiver, if in particular a chip with four diodes formed on a substrate is sealed into a package and external connection conductors each connected to the corresponding diode extend out of the package, such a mutual interference is also increased due to a stray capacitance appearing between the adjacent two of the four external connection conductors. If the four diodes are individually manufactured and packed into a package, it is possible to reduce such mutual interference, but if the above-mentioned four diodes are formed into an integrated circuit, it will be very difficult to decrease the mutual interference. A mutual interference between any adjacent two diodes adversely affects the characteristic of the tuner. Particularly when a greater coupling is involved between the diodes $V_4$ and $V_1$, some oscillation output of the local oscillator 4 leaks increasingly on the input side (i.e., on the diode $V_1$ side) and the increased leakage of the energy of the local oscillator is involved, with an unavoidable decrease of an image frequency suppression (suppression of receiving image frequency) or with a consequent lowering of AGC (Automatic Gain Control) characteristic. That is, such a coupling due to a stray capacitance between the diodes exerts an adverse influence on the characteristics of the tuner. Therefore, a difficulty is presented when such a variable capacity diode device is used as a tuner for the television receiver.

It is accordingly the object of this invention to provide a variable capacity diode device designed to seal into a package a semiconductor chip having a plurality of variable capacity diodes on a semiconductor substrate in the form of an integrated circuit, in which it is possible to decrease a mutual interference occurring between the diodes.

According to this invention, a semiconductor chip having at least three variable capacity diodes formed on a semiconductor substrate is mounted on a grounding member so as to be sealed into a package. A plurality of external ground conductors coupled to the grounding member and external connection conductors coupled to the variable capacity diodes extend out of the package in a manner to be situated in the same plane. Each external ground conductor is arranged between the adjacent two of external connection conductors. The variable capacity diode device so obtained is used in a range of 30 to 300 megaherzs.

This invention can be more fully understood from the following detailed description when taken in conjunction with the accompanying drawings, in which:

FIG. 6 is a comparison diagram in an image frequency suppression between the case (A) in which the variable capacity diode device in FIG. 1 is applied to the tuner shown in FIG. 5 and the case (B) where the FIG. 1 variable capacity diode device unequipped with a fourth grounding conductor is applied to the tuner shown in FIG. 5;

FIG. 7 is a comparison diagram in a local oscillator output leakage between the case (A) where the variable capacity diode device in FIG. 1 is applied to the tuner shown in FIG. 5 and the case (B) where the FIG. 1 variable capacity diode device unequipped with the fourth grounding conductor is applied to the tuner shown in FIG. 5;

Figure 1:
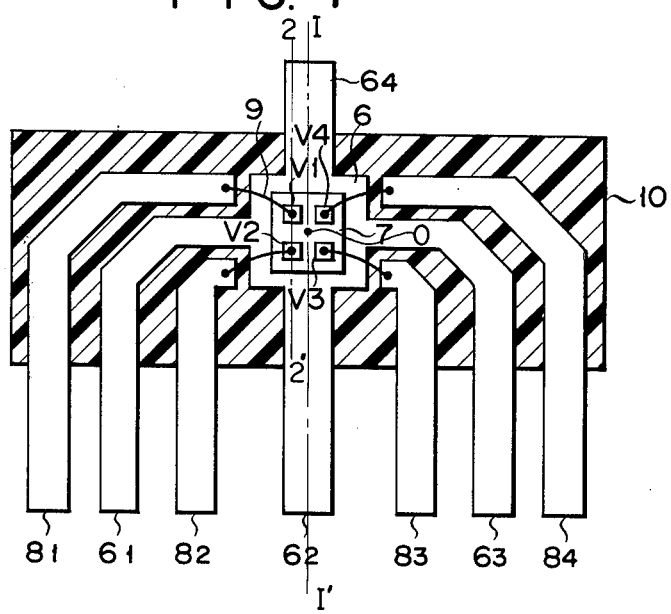
FIG. 1 is a cross-sectional view showing a variable capacity diode device according to one embodiment of this invention.
Figure 2:
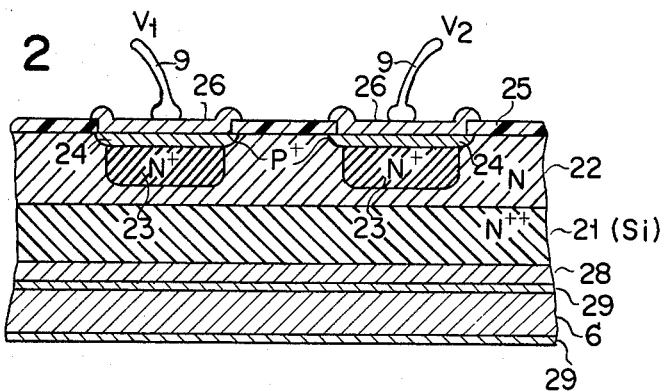
FIG. 2 is a cross-sectional view, as taken along line 2—2 in FIG. 1, showing a construction of a semiconductor chip and a connecting relation between the semiconductor chip and a grounding member.

In FIG. 1, first to fourth strip-like external ground conductors $6_1$ to $6_4$ are integrally formed on a grounding member or a support plate 6 for grounding. A semiconductor chip 7 is mounted on the support plate 6 and four variable capacity diodes $V_1$ to $V_4$ are formed in an IC form on a semiconductor substrate. The variable diodes $V_1$ and $V_2$, viewed in their cross section, are arranged as shown in FIG. 2. That is, an N type silicon (Si layer 22) with a phosphor impurity of about $10^{15}$cc is epitaxially grown on an $N^{++}$ silicon layer having a phosphor impurity of more than $10^{20}$/cc. Phosphor ion is injected by an ion implantation method into the N layer 22 and diffused to form $N^+$ regions 23 having a surface concentration of $10^{17}$ to $10^{18}$/cc. Boron (B) is thermally diffused in the surface of the $N^+$ region 23 to form a $P^+$ region 24 having a concentration of more than $10^{20}$/cc. In consequence, a P-N junction is formed between the $N^+$ region 23 and the $P^+$ region 24 so that a depletion layer is mainly formed by a reverse bias within the $N^+$ region 23. The surface portion of the resultant semiconductor structure is covered with a $SiO_2$ insulating film 25 except for the surface portion of the P+ region and an Al electrode 26 is evaporated on the P+ region. A connection wire 9 is connected to the Al electrode 26. The chip 7 so constructed is bonded on the support plate 6 by means of a thermal pressure bonding method and preferably it is bonded through a Si-Al eutectic junction 28. That is, the surface of the support plate 6 is plated with a gold (Au) 29 and the Au plating layer 29, together with silicon (Si) of the silicon layer 21, forms the Si-Al eutectic layer 28. Such a junction bonding method permits a decrease of resistance of an electric current flow across the diodes to the support plate, thereby preventing a mutual electrical interference between the diodes as will be described later. Referring back to FIG. 1, first, second, third and fourth strip-like external connection conductors $8_1$, $8_2$, $8_3$ and $8_4$ are disposed around the support plate 6 and between the paired external ground conductors $6_4$ and $6_1$; $6_1$, $6_2$; $6_2$, $6_3$ and $6_3$, $6_4$, respectively. The connection wire 9 of the diodes $V_1$ to $V_4$ is connected to one end of the external connection conductors $8_1$ to $8_4$. As will be apparent from FIG. 1 the diodes $V_1$ to $V_4$ are arranged in a symmetrical relation to the center O of the chip 7. The external connection conductors $8_2$, $8_3$; $8_1$, $8_4$; axisymmetrically extend with respect to a dot-chain line I—I passing through the center O, respectively, and are bent partway substantially at right angles. The opposite ends of the external connection conductors all extend from one side of the package 10. As a result, a Single In line Package (SIP) is formed. The external ground conductors $6_1$ and $6_3$ axisymmetrically extend with respect to the dot-chain line I-I' and are bent partway substantially at right angles. The external ground conductors $6_1$ and $6_3$, together with the external connection conductors $8_1$ to $8_4$, form the same side pin terminals of the SIP package. The external ground conductors $6_1$ and $6_4$ extend along the dot-chain line. The external ground conductor $6_2$ extends on the same side as the external ground conductors $6_1$ and $6_3$ and forms the terminal pin of the SIP package, whereas the external ground conductor $6_4$ extends in a direction opposite to that in which the external ground conductor $6_2$ extends.

The variable capacity diode device as mentioned above can be assembled, for example, as follows. At first, a lead frame is prepared in which the external ground, external connection conductors and support plate 6 for grounding are disposed in a positional relation as shown in FIG. 1 and supported on a single common plate not shown. A semiconductor chip 7 is mounted on the support plate 6 and then a connection wire 9 is bonded at one end to the anode terminal of a diode and at the other end to a corresponding external connection conductor by means of, for example, ultrasonic bonding. The required section is sealed by, for example, an epoxy resin to form a package 10. The common plate not shown is cut off after the sealing. As the exposed ends of the external ground conductors and external connection conductor, pins can be used so as to make easy connection to the outside device.

According to the so formed variable capacity diode device, each ground connection conductor is disposed between the adjacent two external connection conductors and it is experimentally proved, as will be later described, that, even if no separating means for diodes is provided within the semiconductor chip, a mutual interference can be satisfactorily prevented. In FIG. 1 it is important that the external connection conductor $6_4$ extend out of the package 10. It is also proved that in the absence of the external ground conductor $6_4$ a mutual interference occurs due to an electrostatic or electromagnetic coupling between the external connection conductors $8_1$ and $8_4$. Since in the embodiment the diodes $V_1$, $V_4$; $V_2$, $V_3$, external ground conductors $6_1$, $6_3$; and external connection conductors $8_1$, $8_4$; $8_2$, $8_3$ are respectively arranged in an axisymmetric relation to the dot-chain line I-I', a stray capacitance with respect to ground of the respective connection conductors $8_1$ to $8_4$ can be made substantially equal. The stray capacitance can be adjusted dependent upon the positional relation and size of the respective external connection conductors $8_1$ to $8_4$ and external ground conductors $6_1$ to $6_4$. In this embodiment, such an adjustment is made by adopting such an axisymmetric arrangement. Since a stray capacitance with respect to ground of the respective external connection conductors $8_1$ to $8_4$ is made substantially equal and, in consequence, the capacitive value of the four variable capacity diodes is made substantially equal, the capacity of the diode on any output pin is made substantially equal with the resultant advantage.

Figure 3:
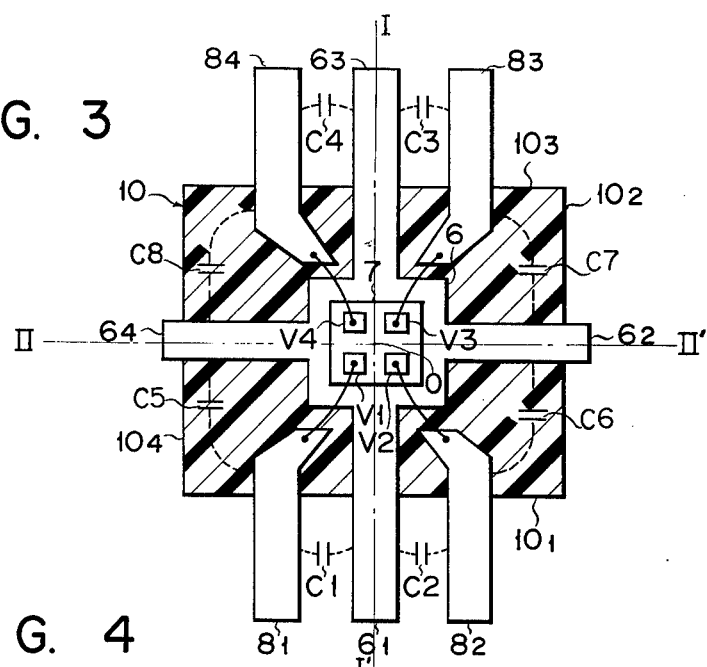
FIG. 3 is a cross-sectional view showing a variable capacity diode device according to another embodiment of this invention.

FIG. 3 shows a second embodiment of this invention in which like reference numerals are employed to designate parts or elements corresponding to those shown in FIG. 1. In this embodiment, the first external ground conductor $6_1$ arranged along a dot-dash line I-I' passing the center O of the chip, as well as the first and second external connection conductors $8_1$ and $8_2$ disposed in a symmetrical relation to the dot-dash line I-I', extends out of the first side surface $10_1$ of the package. Stray capacitances $C_1$ and $C_2$ are created one between the conductors $8_1$ and $6_1$ and one between the conductors $8_2$ and $6_1$. The third external ground conductor $6_3$ arranged along the line I-I', as well as the third and fourth external connection conductors $8_3$ and $8_4$ disposed in a symmetrical relation to the dot-dash line I-I', extends out of the third side surface $10_3$. Stray capacitances $C_3$ and $C_4$ are created one between the conductors $6_3$ and $8_3$ and one between the conductors $6_3$ and $8_4$. The second external ground conductor $6_2$ arranged along a dot-dash line II-II' passing the center O of the chip and perpendicular to the line I-I' extends from the second side surface $10_2$ of the package 10. The fourth external ground conductor $6_4$ arranged along the line II-II' extends from the fourth side surface $10_4$ of the package. Stray capacitances $C_5$ and $C_8$ are created one between the external connection conductor $8_1$ and the external ground conductor $6_4$ and one between the external connection conductor $8_4$ and the external ground conductor $6_4$, whereas stray capacitances $C_6$ and $C_7$ are created one between the external connection conductor $8_2$ and the external ground conductor $6_2$ and one between the external connection conductor $8_3$ and the external ground conductor $6_2$. The first to fourth diodes $V_1$ to $V_4$ are arranged in a symmetrical relation with respect to the first to fourth external connection conductors when viewed from the center O of the chip. The positional relation and shape of the external connection conductors and external ground conductors are so determined as to make stray capacitances of connection conductors $8_1$ to $8_4$ with respect to ground $C_1 + C_5$, $C_2 + C_6$, $C_3 + C_7$, $C_4 + C_8$ mutually equal. The external ground conductor $6_1$ at the first side surface $10_1$ of the package 10 positively prevents a capacitive coupling between the external connection conductors $8_1$ and $8_2$, whereas the external ground conductors $6_3$ at the third side surface $10_3$ of the package 10 positively prevents a capacitive coupling between the external connection conductors $8_3$ and $8_4$.

Figure 4:
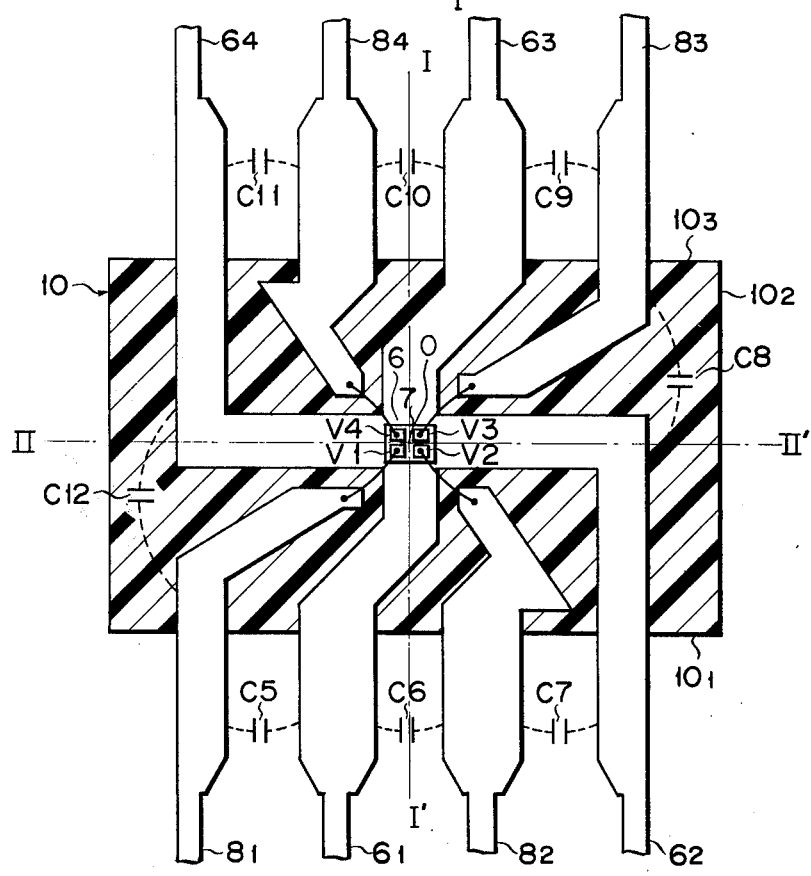
FIG. 4 is a cross-sectional view showing a variable capacity diode device according to another embodiment of this invention.

FIG. 4 shows the third embodiment of this invention. First and second external ground conductors $6_1$ and $6_2$ and first and second external connection conductors $8_1$ and $8_2$ extend from the first side surface $10_1$ of the package 10, and third and fourth external ground conductors $6_3$ and $6_4$ and third and fourth external connection conductors $8_3$ and $8_4$ extend from the opposite third side surface $10_3$ of the package 10. As a result, a Dual In line Package (DIP) is formed. In this embodiment, the external ground conductors $6_2$ and $6_4$ extend along a dot-dash line II–II' passing through the center O of the chip and are bent partway substantially at right angles. As shown in FIG. 4 the external ground conductor $6_2$ extends downward and the external ground conductor $6_4$ extends upward. The external ground conductors $6_2$ and $6_4$ are derived, as pin terminals, from the respective side surfaces of the package. An upwardly extending external ground conductor $6_4$ and downwardly extending external ground conductor $6_2$ are bent partway so that they are parallel to a dot-dash line I–I passing through the center O of the chip at opposite sides. The external ground conductors $6_1$ and $6_4$ are derived, as pin terminals, from the respective side surface of the package. Each of the external connection conductors $8_1$ to $8_4$ is alternately arranged between the adjacent two external ground conductors. In this case, the shape of the external connection conductors and external ground conductors are so selected as to make mutually equal stray capacitances each of which is created between an external connection conductor and the adjacent two external ground conductors. That is, stray capacitances $C_5$ and $C_{12}$ are created one between the conductors $6_1$ and $8_1$ and one between the conductors $6_4$ and $8_1$; stray capacitances $C_6$ and $C_7$, one between the conductors $6_1$ and $8_2$, and one between the conductors $6_2$ and $8_2$; stray capacitances $C_8$ and $C_9$, one between conductors $6_2$ and $8_3$ and one between the conductors $6_3$ and $8_3$; and stray capacitances $C_{10}$ and $C_{11}$, one between the conductors $6_3$ and $8_4$ and one between the conductors $6_4$ and $8_4$. In order to make equal the stray capacitance at each of the external connection conductors, the positional relation and size of the external connection conductors and external ground conductors are so determined as to satifsy the following relation:

$$(C_5 + C_{12}) = (C_6 + C_7) = (C_8 + C_9) = (C_{10} + C_{11})$$

Figure 5:
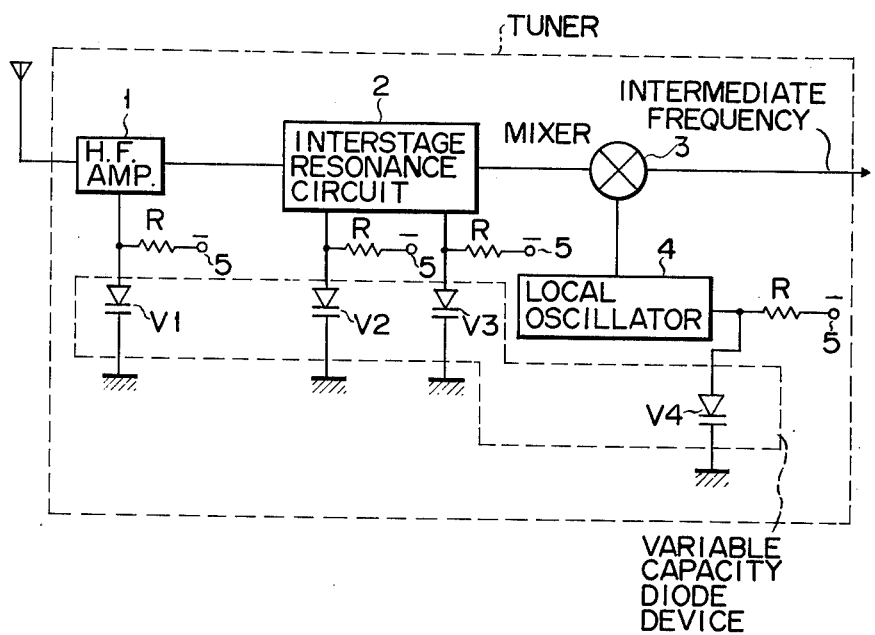
FIG. 5 is a block diagram showing the case where the variable capacity diode device according to this invention is applied to a tuner circuit of a television receiver.

Suppose, for example, that the variable capacity diode device as shown in FIGS. 1 to 4 is connected to a tuner circuit in a television receiver. As shown in FIG. 5 the first external connection conductor $8_1$ is connected to the high frequency amplifier circuit 1; the second and third external connection conductors $8_2$ and $8_3$, to the interstage resonance circuit 2; and the fourth external connection conductor $8_4$, to the local oscillator 4. As already mentioned above, the same control voltage 5 is applied through a corresponding respective resistor R to the diodes $V_1$ to $V_4$. In this case, any external ground conductor is necessarily disposed between the adjacent two external connection conductors and it is therefore possible to eliminate any possible mutual interference of high frequency signals between the diodes which are connected to any two external connection conductors. If the stray capacitance of each diode circuit is determined to have an equal value with respect to the corresponding external ground conductor, a change in the capacitance of each diode circuit with respect to the control voltage is made equal, thus improving the characteristic of the tuner.

Figure 8:
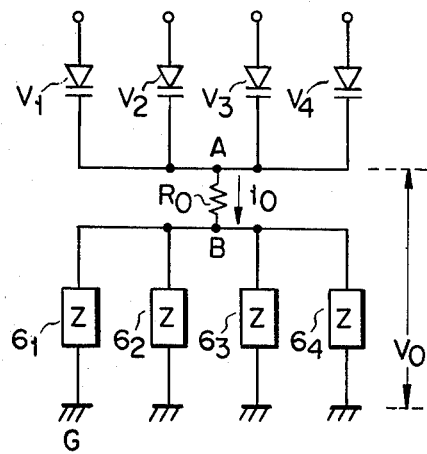
FIG. 8 is an equivalent circuit diagram of the variable capacity diode device according to this invention.

In the variable capacity diode device according to this invention the semiconductor chip is bonded through a eutectic alloy such as Si-Au to the support plate as shown in FIG. 2 and many external ground conductors are involved. Therefore, an electrical resistance between each diode and ground can be made small, thereby preventing a mutual signal coupling between the diodes. That is, the diode device according to this invention can be expressed as an equivalent circuit as shown in FIG. 8. In FIG. 8 $R_0$ shows a junction resistance between the semiconductor chip and the support plate and Z shows the impedances of the external ground conductors $6_1$ to $6_4$ which are each assumed to have an equal value by way of explanation.

With the variable capacity diodes $V_1$ to $V_4$ in the operative stage, electric currents of the diodes $V_1$ to $V_4$ to ground are combined into a resultant $I_0$ which in turn flows through the resistor $R_0$ and each impedance Z into ground G. The current through the resistor and resulting impedance of the four impedances develops a respective voltage. A resultant voltage $V_0$ $$V_0 = (R_0 = Z/4) I_0$$

Since the resultant voltage $V_0$ becomes part of the biasing voltage of the variable capacity diodes $V_1$ to $V_4$, electric current through the respective diode exerts an influence on the biasing voltage of the other diode. As will be evident from the above-mentioned equation, the smaller the resultant resistance $(R_0 + Z/4)$, the lesser the mutual interference of the diode.

FIGS. 6 and 7, each, show results of experiments conducted with respect to a tuner of FIG. 5 to which the diode device shown in FIG. 1 is applied (this case is indicated by A) and the tuner of FIG. 5 to which the FIG. 1 diode device unequipped with the fourth external ground conductor $6_4$ is applied (this case is indicated by B). In FIG. 6 a channel number and the corresponding freequency band are plotted as abscissa and an image frequency suppression measured in dB is plotted as ordinate. In FIG. 7 a channel number and the corresponding frequency band are plotted as abscissa and a leakage of a local oscillator output to a television tuner (measured in dB) is plotted as ordinate. It will be appreciated from FIG. 6 that A is improved by a value of about 10dB in respect of the image frequency suppression as compared with B. It is also appreciated from FIG. 7 that A is decreased by a value of about 10dB in respect of leakage of the local oscillator output to the tuner.

Figure 9:
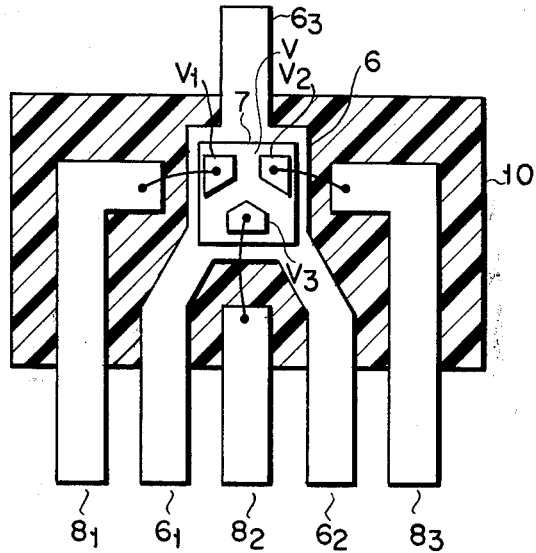
FIG. 9 is a cross-sectional view showing a variable capacity diode device according to another embodiment of this invention.

The external connection conductors, external ground conductors and electroconductive member 6 for grounding can all be printed on an insulating substrate. Although the fourdiode type chip has been explained in conjunction with this invention, this invention is not restricted thereto. For example, a chip with three diodes or more can be used in this invention. FIG. 9 shows, by way of example, three diodes $V_1$ to $V_3$ formed on a single semiconductor substrate. In this case, the external ground conductors $6_1$, $6_2$ and external connection conductors $8_1$ to $8_3$ extend from one side surface of the package and the external ground conductor $6_3$ extends from the opposite side surface.

What we claim is:

1. A variable capacity diode device comprising:
   a semiconductor chip having at least three variable capacity diodes formed on a semiconductor substrate;
   an electroconductive member for ground on which the semiconductor chip is mounted so as to be sealed within a package;
   a plurality of external ground conductors, each connected to the electroconductive member and each extending out of the package;
   a plurality of external connection conductors, each connected to a variable capacity diode, each extending out of the package, and each being supplied with a signal different from each other having a frequency of 30 to 300 megahertz;
   each external ground conductor being situated between two adjacent external connection conductors for preventing signal interference between the two adjacent external connection conductors.

2. The variable capacity diode device according to claim 1, comprising first to fourth variable capacity diodes arranged substantially in a point-symmetrical relation, first to fourth strip-like external connection conductors connected to the first to fourth variable capacity diodes, a first striplike external ground conductor disposed between the first and second external connection conductors, a second strip-like external ground conductor disposed between the second and third external connection conductors, a third strip-like external ground conductor disposed between the third and fourth external connection conductors and a fourth strip-like external ground conductor disposed between the fourth and first external connection conductors.

3. The variable capacity diode device according to claim 2, in which said first to fourth external connection conductors and said first to third external ground conductors extend from one side surface of the package and said fourth external ground conductor extends from the opposite side surface of the package.

4. The variable capacity diode device according to claim 2, in which said first and second external connection conductors and said first external ground conductor extend from a first side surface of the package, said third and fourth external connection conductors and third external ground conductor extend from the opposite third side surface of the package, said second external ground conductor extends from that second side surface of the package which is situated between said first and third side surfaces, and said fourth external ground conductor extends from a fourth side surface of the package.

5. The variable capacity diode device according to claim 4, in which each of stray capacitances created one between said first external ground conductor and said first external connection conductor and one between said first external ground conductor and said second external connection conductor is made substantially equal to each of stray capacitances created one between said third external ground conductor and said third external connection conductor and one between said third external ground conductor and said fourth external connection conductor.

6. The variable capacity diode device according to claim 2, in which said first and second external connection conductors and said first and second external ground conductors extend from one side surface of the package, and said third and fourth external connection conductors and said third and fourth external ground conductors extend from the opposite side surface of the package.

7. The variable capacity diode device according to claim 6, in which a sum of the two stray capacitances created between any one of the external connection conductors and the adjacent two external ground conductors is substantially equal to a sum of the two stray capacitances created by any other external connection conductor and the adjacent two external ground conductors.

8. A variable capacity diode device comprising a semiconductor chip having first to fourth variable capacity diodes formed on a semiconductor substrate in the form of an integrated circuit in a manner to be in a point-symmetrical relation with respect to the center point of the substrate; a support plate for grounding on which the semiconductor chip is mounted; first to fourth external connection conductors connected to the anode of the variable capacity diodes, first to fourth external ground conductors connected to the support plate and each situated between the adjacent two of the external connection conductors; and a package for holding the semiconductor chip and each of the external ground conductors and external connection conductors in a predetermined positional relation and sealing them, in which said first and second external connection conductors and said first and second external ground conductors extend from one side surface of said package, said third and fourth external connection conductors and said third and fourth external ground conductors extend from the opposite side surface of said package, and said external connection conductors and said external ground conductors are so shaped and arranged that a sum of capacitances between any one of the external connection conductors and the adjacent two external ground conductors is substantially equal to a sum of capacitances created by any other external connection conductor and the adjacent two external ground conductors.

9. The variable capacity diode device according to claim 1, in which said electroconductive member for ground is bonded to said semiconductor chip through a silicon-gold eutectic alloy.

* * * * *